(12) United States Patent
Seo

(10) Patent No.: US 12,212,282 B2
(45) Date of Patent: *Jan. 28, 2025

(54) OSCILLATOR

(71) Applicant: SEIKO EPSON CORPORATION, Tokyo (JP)

(72) Inventor: Kentaro Seo, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 81 days.

This patent is subject to a terminal disclaimer.

(21) Appl. No.: 18/171,405

(22) Filed: Feb. 20, 2023

(65) Prior Publication Data

US 2023/0268884 A1 Aug. 24, 2023

(30) Foreign Application Priority Data

Feb. 21, 2022 (JP) ................. 2022-024535

(51) Int. Cl.
*H03B 5/04* (2006.01)
*H03B 5/32* (2006.01)

(52) U.S. Cl.
CPC ............... *H03B 5/04* (2013.01); *H03B 5/32* (2013.01)

(58) Field of Classification Search
CPC ........................................................ H03B 5/04
USPC ............................................................. 331/176
See application file for complete search history.

(56) References Cited

U.S. PATENT DOCUMENTS

| 2020/0021243 A1 | 1/2020 | Uehara |
| 2020/0272179 A1* | 8/2020 | Matsukawa .......... H03H 9/0519 |
| 2020/0313677 A1 | 10/2020 | Seo |
| 2023/0268883 A1* | 8/2023 | Seo ..................... H03B 5/36 |
| | | 331/70 |

FOREIGN PATENT DOCUMENTS

JP 2020-161922 A 10/2020

* cited by examiner

Primary Examiner — Joseph Chang
(74) Attorney, Agent, or Firm — Harness, Dickey & Pierce, P.L.C.

(57) ABSTRACT

An oscillator includes: a resonator element; an oscillation circuit configured to oscillate the resonator element and generate a clock signal; a first temperature sensor; a digital control circuit configured to operate based on the clock signal and output a control signal based on a temperature detected by the first temperature sensor; a temperature control circuit configured to output a control voltage based on the control signal; a temperature control element configured to control a temperature of the resonator element based on the control voltage; a second temperature sensor; and a second temperature sensor monitoring circuit including an analog circuit and configured to monitor a temperature detected by the second temperature sensor. The temperature control circuit stops a supply of the control voltage to the temperature control element when an abnormality in the temperatures of the first temperature sensor and the second temperature sensor is detected.

6 Claims, 10 Drawing Sheets

OSCILLATOR

The present application is based on, and claims priority from JP Application Serial Number 2022-024535, filed Feb. 21, 2022, the disclosure of which is hereby incorporated by reference herein in its entirety.

BACKGROUND

1. Technical Field

The present disclosure relates to an oscillator.

2. Related Art

In the related art, an oven controlled crystal oscillator (OCXO) is known, which has a function of preventing a fluctuation of an oscillation frequency due to a temperature change. For example, JP-A-2020-161922 discloses an oscillator in which a temperature detection signal output from a temperature sensing element is converted into a digital signal, and in which a digital signal processing circuit controls a temperature control element based on the digital signal.

In the related art, when the temperature control element is not appropriately controlled due to a failure, an abnormality such as excessive heat generation of the temperature control element may occur. A plurality of causes may be considered as the cause of the failure. In the related art, a method of detecting such an abnormality is not disclosed.

SUMMARY

According to an aspect of the present disclosure, an oscillator includes: a resonator element; an oscillation circuit configured to oscillate the resonator element to generate a clock signal; a first temperature sensor; a digital control circuit configured to operate based on the clock signal and output a control signal based on a temperature detected by the first temperature sensor; a temperature control circuit configured to output a control voltage based on the control signal; a temperature control element configured to control a temperature of the resonator element based on the control voltage; a second temperature sensor; and a second temperature sensor monitoring circuit including an analog circuit and configured to monitor a temperature detected by the second temperature sensor. The digital control circuit monitors the temperature detected by the first temperature sensor and stops a supply of the control voltage to the temperature control element performed by the temperature control circuit when an abnormality in the temperature is detected. The second temperature sensor monitoring circuit stops the supply of the control voltage to the temperature control element performed by the temperature control circuit when an abnormality in the temperature of the second temperature sensor is detected.

DESCRIPTION OF EXEMPLARY EMBODIMENTS

Hereinafter, embodiments of the present disclosure will be described in detail with reference to drawings.

First Embodiment

Figure 1:
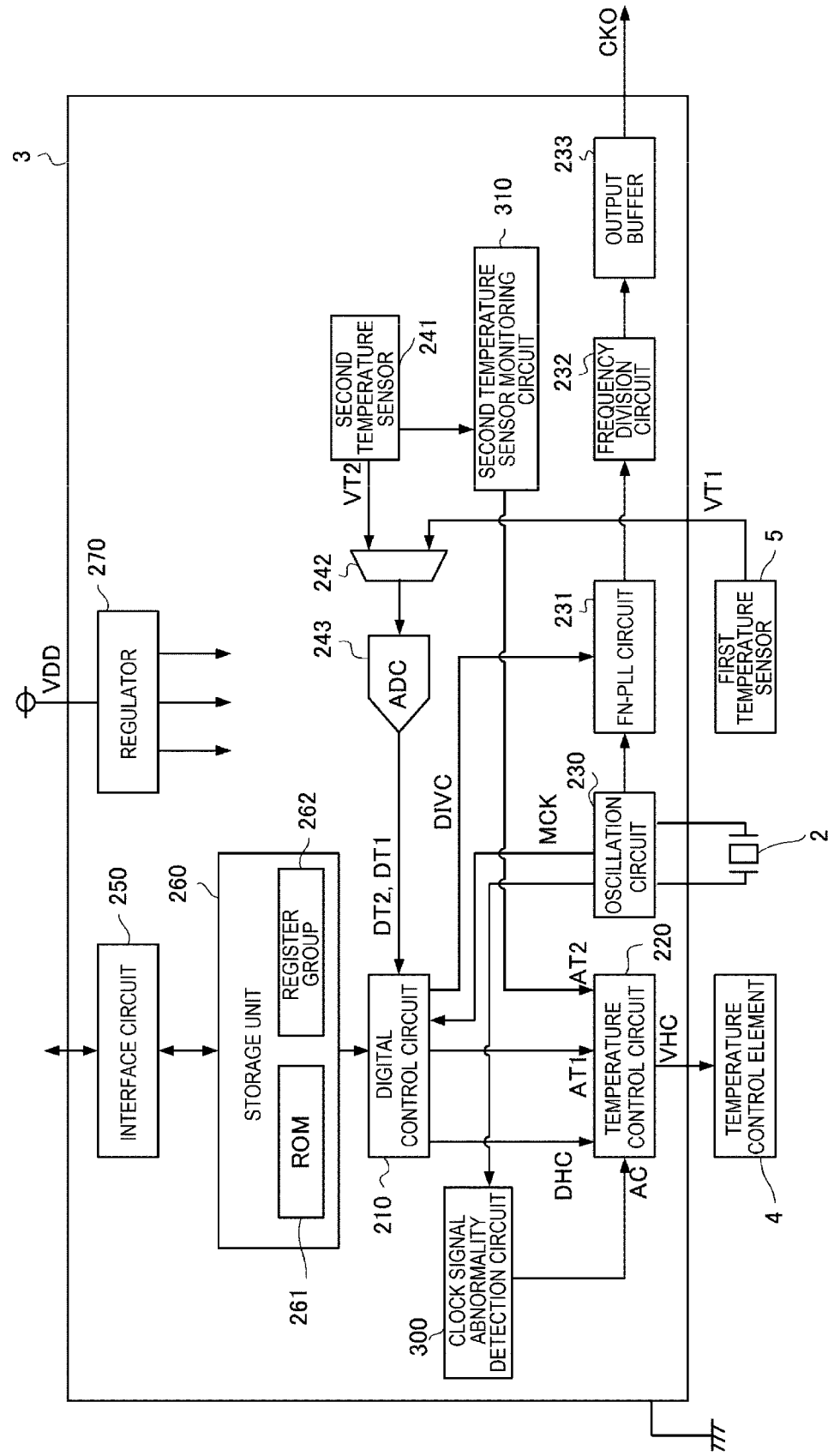
FIG. 1 is a functional block diagram of an oscillator according to a first embodiment.

An oscillator 1 according to a first embodiment of the present disclosure is an oven controlled crystal oscillator (OCXO) including a quartz crystal resonator. FIG. 1 is a functional block diagram of the oscillator 1 according to the embodiment. The oscillator 1 according to the embodiment is formed in a housing, which is not shown, in which an accommodation space is formed. The oscillator 1 includes a resonator element 2, an integrated circuit 3, a temperature control element 4, and a first temperature sensor 5.

The resonator element 2 is an SC cut quartz crystal resonator. The resonator element 2 is not limited to the SC cut. For example, an AT cut or BT cut quartz crystal resonator, a surface acoustic wave (SAW) resonator, or the like can be used. As the resonator element 2, for example, a piezoelectric resonator or a micro electro mechanical systems (MEMS) resonator other than the quartz crystal resonator may be used. In the embodiment, the resonator element 2 is accommodated in a housing which is not shown. The integrated circuit 3 is a chip element formed by integrating various circuits.

The temperature control element 4 is an element that adjusts a temperature of the resonator element 2, and is a heat generation element such as a power transistor. In the embodiment, the temperature control element 4 is coupled to the housing that accommodates the resonator element 2. Heat generated by the temperature control element 4 is controlled according to a control voltage VHC supplied from the integrated circuit 3. In the embodiment, the resonator element 2 is heated by the heat generated by the temperature control element 4, and the temperature of the resonator element 2 is kept substantially constant. By keeping the temperature of the resonator element 2 substantially constant, frequency stability can be improved.

A first temperature sensor 5 detects a temperature and outputs a first temperature detection signal VT1 having a voltage level corresponding to the detected temperature. The first temperature detection signal VT1 output from the first temperature sensor 5 is supplied to the integrated circuit 3. That is, the first temperature sensor 5 is present outside the integrated circuit 3. The first temperature sensor 5 and the integrated circuit 3 are electrically coupled to each other by a wiring which is not shown. In the embodiment, the first temperature sensor 5 detects a temperature around the resonator element 2. In the embodiment, the first temperature sensor 5 is in contact with the housing that accommodates the resonator element 2. As the first temperature sensor 5, for example, a thermistor or a platinum resistor can be used.

The integrated circuit 3 includes a digital control circuit 210, a temperature control circuit 220, an oscillation circuit 230, a fractional N-phase locked loop (PLL) circuit 231, which is denoted as FN-PLL circuit 231 in FIG. 1, a frequency division circuit 232, an output buffer 233, a second temperature sensor 241, a selector 242, an analog-to-digital conversion circuit 243, which is denoted as ADC in FIG. 1, an interface circuit 250, a storage unit 260, a regulator 270, a clock signal abnormality detection circuit 300, and a second temperature sensor monitoring circuit 310.

The oscillation circuit 230 is electrically coupled to both ends of the resonator element 2, and is a circuit that amplifies an output signal of the resonator element 2 and feeds back the amplified signal to the resonator element 2, thereby causing the resonator element 2 to oscillate and outputting an oscillation signal. For example, the oscillation circuit 230 may be an oscillation circuit using an inverter as an amplification element, or may be an oscillation circuit using a bipolar transistor as an amplification element.

The fractional-N PLL circuit 231 converts a frequency of the oscillation signal output from the oscillation circuit 230 into a frequency corresponding to a division ratio indicated by a delta-sigma modulated division ratio control signal DIVC. The frequency division circuit 232 divides the oscillation signal output from the fractional-N PLL circuit 231. The output buffer 233 buffers the oscillation signal output from the frequency division circuit 232, and outputs an oscillation signal CKO to the outside of the integrated circuit 3. The oscillation signal CKO is an output signal of the oscillator 1.

The second temperature sensor 241 detects a temperature and outputs a second temperature detection signal VT2 having a voltage level corresponding to the detected temperature. For example, the second temperature sensor 241 can be implemented by a diode or the like. The second temperature sensor 241 is formed in the integrated circuit 3.

The integrated circuit 3 is electrically coupled to a substrate which is not shown, and is electrically coupled to the resonator element 2 via a wiring electrically coupled to the substrate. In the embodiment, the integrated circuit 3 is disposed in the vicinity of the resonator element 2, and the substrate on which the integrated circuit 3 is mounted is not in contact with the housing of the resonator element 2. Therefore, the second temperature sensor 241 is provided at a position that is further away from the resonator element 2 and the temperature control element 4 than is the first temperature sensor 5. Therefore, the second temperature sensor 241 detects a temperature at a position away from the resonator element 2 and the temperature control element 4. Therefore, when an outside air temperature of the oscillator 1 changes in a predetermined range, the temperature detected by the first temperature sensor 5 provided in the vicinity of the temperature control element 4 hardly changes, whereas the temperature detected by the second temperature sensor 241 changes in a predetermined range.

The selector 242 selects and outputs one of the second temperature detection signal VT2 output from the second temperature sensor 241 and the first temperature detection signal VT1 output from the first temperature sensor 5. In the embodiment, the selector 242 selects and outputs the second temperature detection signal VT2 and the first temperature detection signal VT1 in a time division manner.

The analog-to-digital conversion circuit 243 converts the second temperature detection signal VT2 and the first temperature detection signal VT1, which are analog signals output from the selector 242 in the time division manner, into a second temperature code DT2 and a first temperature code DT1, respectively, which are digital signals. The analog-to-digital conversion circuit 243 may convert the second temperature detection signal VT2 and the first temperature detection signal VT1 into the second temperature code DT2 and the first temperature code DT1 after converting the voltage levels of the second temperature detection signal VT2 and the first temperature detection signal VT1 by resistance voltage division or the like.

The digital control circuit 210 outputs a control signal DHC based on the temperature detected by the first temperature sensor 5. In the embodiment, the digital control circuit 210 generates the control signal DHC for controlling the temperature control element 4 based on the first temperature code DT1 indicating the temperature detected by the first temperature sensor 5 and the second temperature code DT2 indicating the temperature detected by the second temperature sensor 241. The digital control circuit 210 may further generate the control signal DHC based on target temperature information of the resonator element 2. The target temperature information of the resonator element 2 is stored in a read only memory (ROM) 261 of the storage unit 260. When the oscillator 1 is powered on, the target temperature information is transferred from the ROM 261 to a predetermined register included in a register group 262 and held therein, and the target temperature information held in the register is supplied to the digital control circuit 210.

The digital control circuit 210 generates the division ratio control signal DIVC for temperature-compensation of a frequency of the oscillation signal based on a set value of a target frequency stored in the storage unit 260 and the second temperature code DT2. As described above, the division ratio control signal DIVC is supplied to the fractional-N PLL circuit 231. The fractional-N PLL circuit 231 converts the frequency of the oscillation signal output from the oscillation circuit 230 into a frequency corresponding to the division ratio indicated by the division ratio control signal DIVC. Accordingly, a frequency of the oscillation signal that slightly changes according to the outside air temperature is temperature-compensated. The oscillation signal output from the fractional-N PLL circuit 231 becomes a substantially constant target frequency regardless of the outside air temperature.

The digital control circuit 210 may include a digital filter that performs low-pass processing on at least a part of the second temperature code DT2 and the first temperature code DT1 output from the analog-to-digital conversion circuit 243 in the time division manner to reduce an intensity of a high-frequency noise signal.

In the embodiment, the digital control circuit 210 is a processor capable of executing various types of processing based on a clock signal. In the embodiment, the digital control circuit 210 operates based on a clock signal (hereinafter, referred to as a master clock signal MCK) obtained by dividing an oscillation signal output from the oscillation circuit 230 by a frequency division circuit which is not shown. The master clock signal MCK may also be used when another digital signal processing circuit present in the integrated circuit 3 operates based on the clock signal.

The temperature control circuit 220 generates and outputs a control voltage VHC based on the control signal DHC generated by the digital control circuit 210. The control voltage VHC is supplied to the temperature control element 4, and a heat generation amount of the temperature control element 4 is controlled according to the control voltage VHC. Accordingly, the temperature of the resonator element 2 is controlled to be substantially constant at a target temperature.

The interface circuit 250 is a circuit for executing data communication with an external device, which is not shown, coupled to the oscillator 1. The interface circuit 250 may be, for example, an interface circuit corresponding to an inter-integrated circuit (I2C) bus or an interface circuit corresponding to a serial peripheral interface (SPI) bus.

The storage unit 260 includes the ROM 261, which is a nonvolatile memory, and the register group 262, which is a volatile memory. In an inspection step at the time of manufacturing the oscillator 1, an external device writes various kinds of data for controlling an operation of each circuit provided in the oscillator 1 to various registers included in the register group 262 via the interface circuit 250 to adjust the circuit. Then, the external device stores the determined various kinds of optimum data in the ROM 261 via the interface circuit 250. When the oscillator 1 is powered on, various kinds of data stored in the ROM 261 are transferred to and held in various kinds of registers included in the register group 262, and the various kinds of data held in the various kinds of registers are supplied to the circuits.

The regulator 270 generates a power supply voltage and a reference voltage of each circuit provided in the integrated circuit 3 based on a power supply voltage VDD supplied from the outside of the oscillator 1.

Prevention of Abnormal Heat Generation

As described above, the oscillator 1 has a function of controlling the temperature of the resonator element 2 by causing the temperature control element 4 to generate heat. Since the temperature control element 4 generates the heat according to the control voltage VHC output from the temperature control circuit 220, the temperature control element 4 may excessively generate the heat when the control voltage VHC is abnormal. Therefore, the oscillator 1 according to the embodiment has a function of stopping the output of the control voltage VHC to the temperature control element 4 when a cause of excessive heat generation of the temperature control element 4 occurs. The oscillator 1 according to the embodiment has a function of stopping the output of the control voltage VHC to the temperature control element 4 when the temperature of the temperature control element 4 increases over a reference.

Figure 2:
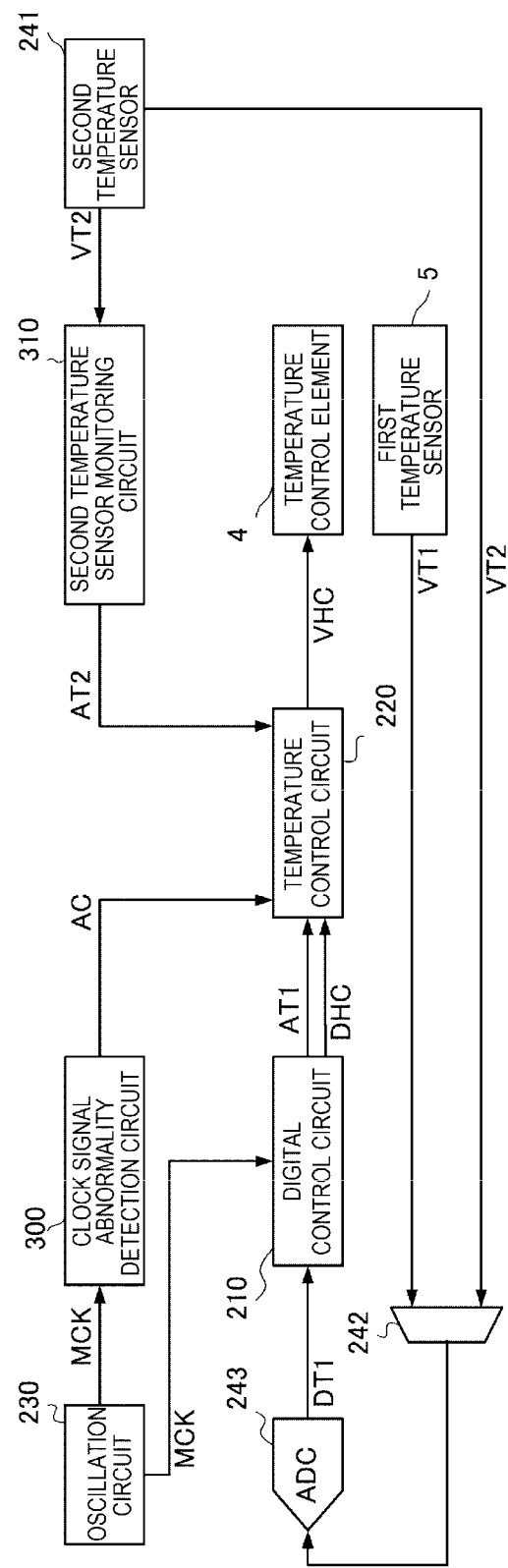
FIG. 2 is a functional block diagram showing a main part of the oscillator according to the first embodiment.

FIG. 2 is a diagram showing a configuration for implementing a function of preventing abnormal heat generation of the temperature control element 4, which is extracted from FIG. 1. The temperature control circuit 220 controls the temperature control element 4 based on the control signal DHC output from the digital control circuit 210. Therefore, when the control signal DHC output from the digital control circuit 210 is abnormal, the temperature control element 4 may excessively generate the heat. One cause of the abnormality in the control signal DHC is an abnormality in the master clock signal MCK. That is, since the digital control circuit 210 operates based on the master clock signal MCK, when the abnormality such as a stop of the master clock signal MCK occurs, the digital control circuit 210 cannot output an appropriate control signal DHC.

Therefore, in the embodiment, the clock signal abnormality detection circuit 300 detects the abnormality in the clock signal. When the clock signal abnormality detection circuit 300 detects the abnormality in the clock signal, the clock signal abnormality detection circuit 300 disables the operation of the temperature control circuit 220 by an output signal AC. That is, a signal indicating "disable" is output to an enable signal node included in the temperature control circuit 220. As a result, the output of the control voltage VHC by the temperature control circuit 220 is stopped, and the heat generation of the temperature control element 4 is stopped. A configuration of the clock signal abnormality detection circuit 300 will be described in detail later.

In the embodiment, output values of the first temperature sensor 5 and the second temperature sensor 241 are also monitored. The first temperature detection signal VT1 output from the first temperature sensor 5 is converted into the first temperature code DT1 via the selector 242 and the analog-to-digital conversion circuit 243. In the embodiment, since the digital control circuit 210 is a processor, by monitoring the first temperature code DT1, it is possible to determine whether the temperature control element 4 abnormally generates the heat. Therefore, the digital control circuit 210 monitors the temperature detected by the first temperature sensor 5, and stops the supply of the control voltage VHC to the temperature control element 4 by the temperature control circuit 220 when the abnormality in the temperature is detected.

Specifically, when a temperature indicated by the first temperature code DT1 exceeds a first reference value, the digital control circuit 210 disables the operation of the temperature control circuit 220 by an output signal AT1. That is, a low-level signal indicating "disable" is output to the enable signal node included in the temperature control circuit 220. As a result, the output of the control voltage VHC by the temperature control circuit 220 is stopped, and the heat generation of the temperature control element 4 is stopped. According to the configuration, when the temperature of the temperature control element 4 excessively increases, the temperature can be controlled so as not to further increase.

Further, in the embodiment, the integrated circuit 3 includes the second temperature sensor monitoring circuit 310. The second temperature sensor monitoring circuit 310 includes an analog circuit, and monitors the second temperature detection signal VT2 detected by the second temperature sensor 241. The second temperature sensor monitoring circuit 310 compares a temperature indicated by the second temperature detection signal VT2 with a second reference value, and disables the operation of the temperature control circuit 220 by an output signal AT2 when the temperature indicated by the second temperature detection signal VT2 exceeds the second reference value. That is, a signal indicating "disable" is output to an enable signal node included in the temperature control circuit 220. As a result, the output of the control voltage VHC by the temperature control circuit 220 is stopped, and the heat generation of the temperature control element 4 is stopped. A configuration of the second temperature sensor monitoring circuit 310 will be described in detail later.

Abnormality in Clock Signal

Figure 3:
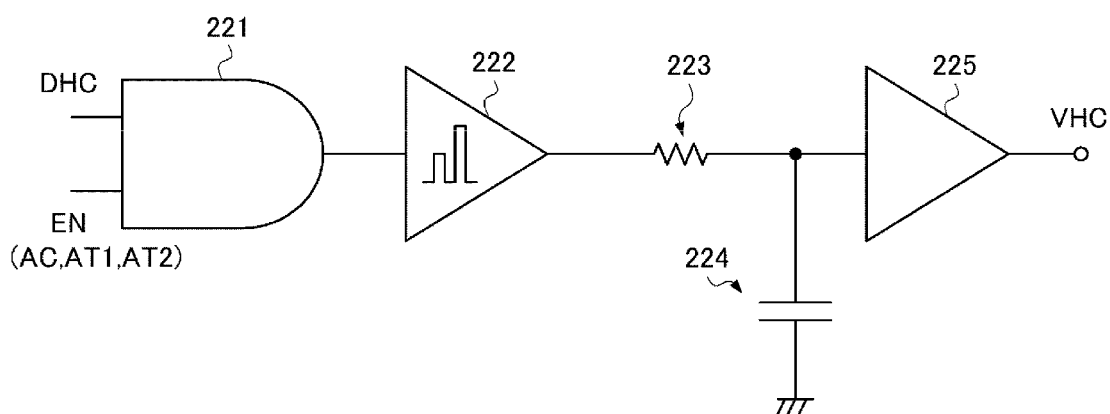
FIG. 3 is a diagram showing a temperature control circuit.

Next, excessive heat generation due to an abnormality in the clock signal will be described. FIG. 3 is a diagram showing a configuration example of the temperature control circuit 220. The temperature control circuit 220 shown in FIG. 3 includes an AND circuit 221, a level shift circuit 222, a resistance element 223, a capacitor 224, and an analog buffer circuit 225. The AND circuit 221 is a two-input AND circuit to which the control signal DHC and an enable signal EN are input. Therefore, when the enable signal EN is at a high level, the AND circuit 221 outputs a signal same as the control signal DHC. When the enable signal EN is at a low level, an output of the AND circuit 221 is fixed to the low level, and the control signal DHC is not output.

The level shift circuit 222 is a circuit that increases an input voltage level, and receives the output of the AND circuit 221 and outputs a level-shifted voltage. In the embodiment, the level shift circuit 222 is a circuit for generating a voltage at a level necessary for causing the temperature control element 4 to generate the heat from the voltage level of the control signal DHC. Specifically, in the embodiment, the control signal DHC output by the digital control circuit 210 is expressed by a predetermined voltage value that can be output by the digital control circuit 210. In the embodiment, the voltage value is 1.5 V at the high level and 0 V at the low level. The AND circuit 221 outputs a signal having a magnitude same as the control signal DHC.

On the other hand, in the embodiment, a maximum value of the voltage necessary for controlling the temperature control element 4 is larger than 1.5 V. For example, when the temperature control element 4 is a power transistor, an example of the maximum value of the voltage level necessary for controlling the power transistor is 2.8 V. In this case, the level shift circuit 222 increases the input voltage level from 1.5 V to 2.8 V.

An output node of the level shift circuit 222 is electrically coupled to one node of the resistance element 223. The other node of the resistance element 223 is electrically coupled to an input node of the analog buffer circuit 225. The capacitor 224 is electrically coupled between the input node of the analog buffer circuit 225 and a ground node. With such a circuit, the resistance element 223 and the capacitor 224 constitute a low-pass filter. Therefore, an output voltage of the level shift circuit 222 is supplied to the analog buffer circuit 225 via the low-pass filter. The analog buffer circuit 225 is a voltage follower circuit and outputs a voltage same as the input voltage.

In the above configuration, when the enable signal EN of the temperature control circuit 220 is at the high level, the output voltage of the level shift circuit 222 is the same as the control signal DHC during an ON or OFF period, although the maximum value of the voltage is corrected. Therefore, when the enable signal EN of the temperature control circuit 220 is at the high level, a signal obtained by causing the low-pass filter to act on the control signal DHC is output from the analog buffer circuit 225. With such a circuit, the temperature control circuit 220 implements the control of the temperature control element 4 by pulse density modulation (PDM).

Figure 4:
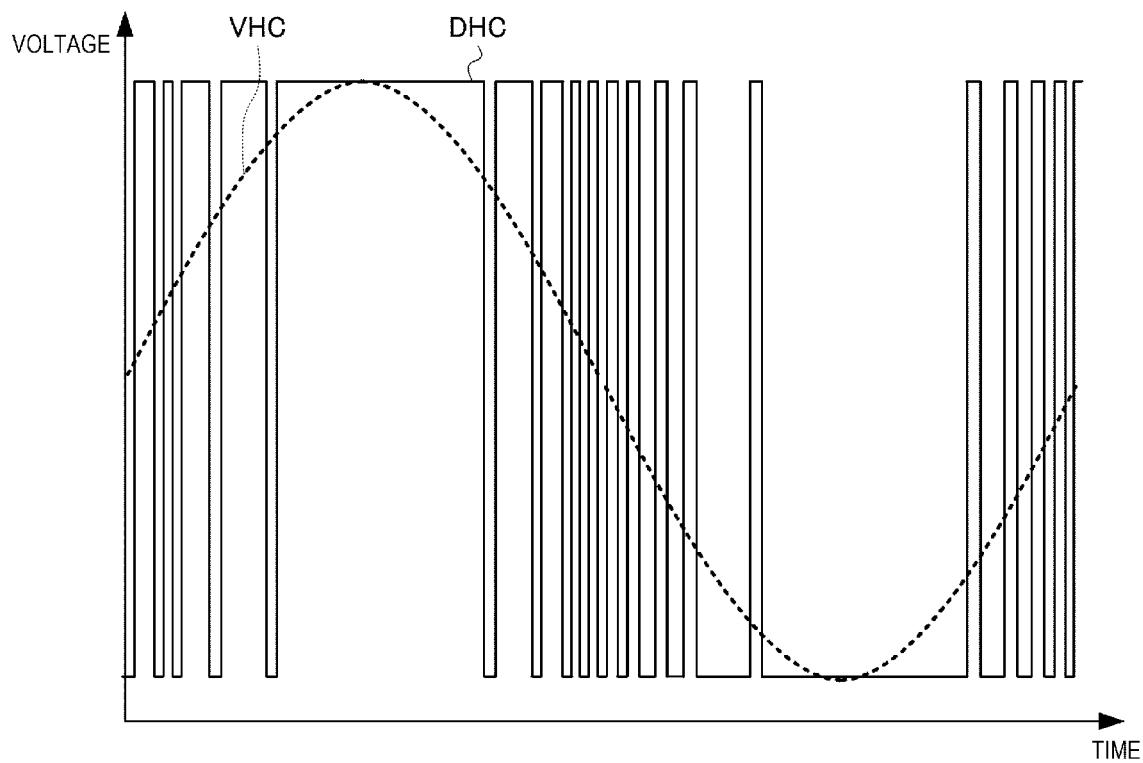
FIG. 4 is a diagram showing an example of waveforms of a control signal and a control voltage.

FIG. 4 is a diagram showing an example of waveforms of the control signal DHC and the control voltage VHC according to the embodiment. In FIG. 4, a horizontal axis represents a time, and a vertical axis represents a voltage. In the example in FIG. 4, a 1-bit control signal DHC is a code modulated by the pulse density modulation. On the other hand, the control voltage VHC output from the temperature control circuit 220 is a signal obtained by demodulating the control signal DHC by the low-pass filter. FIG. 4 shows an example in which a demodulated signal is a sine wave signal.

As described above, according to the pulse density modulation, the voltage of the control voltage VHC output from the temperature control circuit 220 can be adjusted by a pulse density of the control signal DHC. In the pulse density modulation as described above, the higher the pulse density, that is, the longer the high-level period of the control signal DHC, the higher the voltage value of the control voltage VHC. Therefore, when the control signal DHC is abnormal and the high-level period of the control signal DHC is longer than expected, the heat generation amount by the temperature control element 4 is larger than expected.

Figure 5:
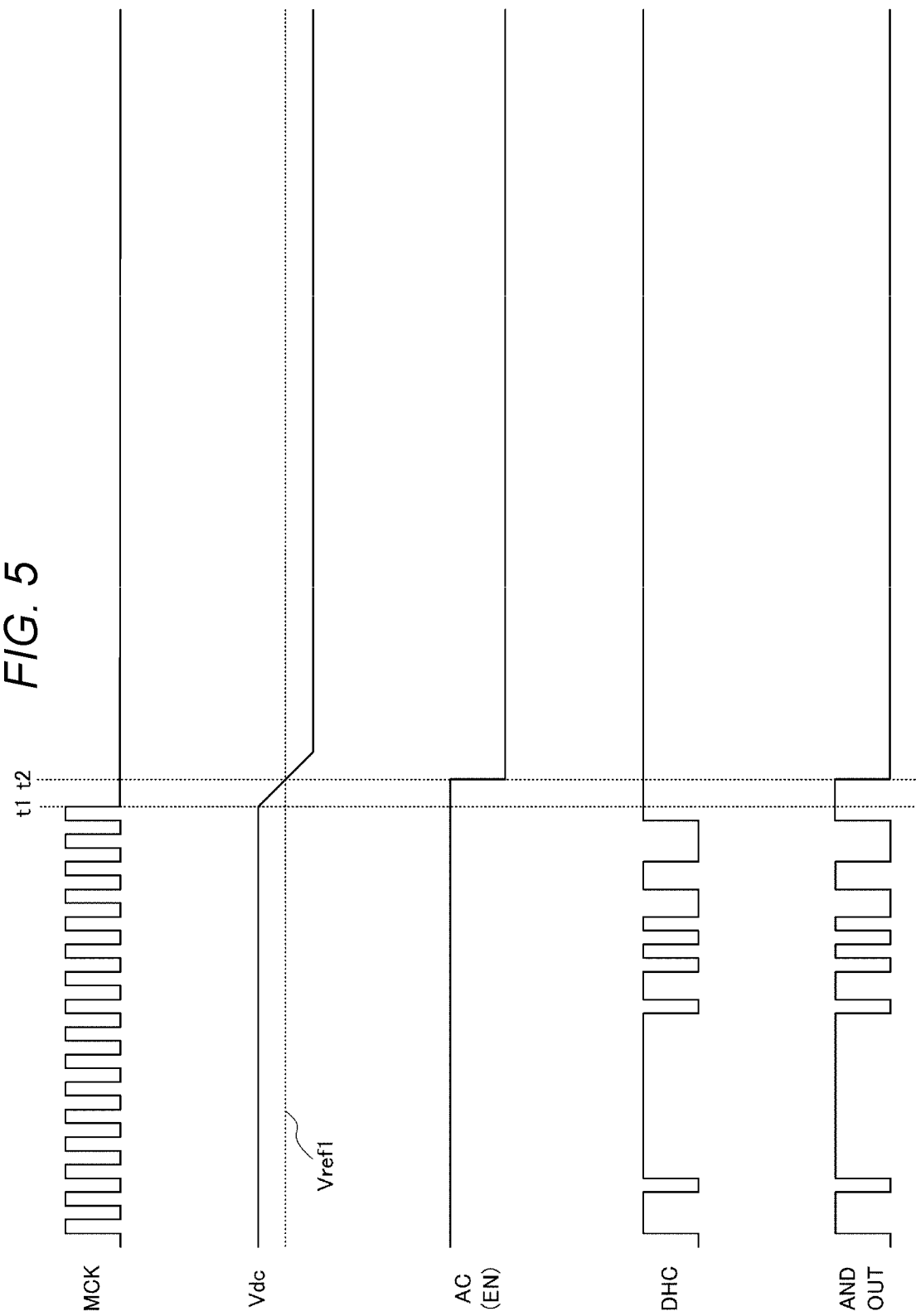
FIG. 5 is a timing chart of signals related to detection of an abnormality in a clock signal.

In the above configuration, when an abnormality occurs in the clock signal for operating the digital control circuit 210 which is a circuit for generating the control signal DHC, the high-level period of the control signal DHC is longer than expected, and the temperature control element 4 may excessively generate the heat. FIG. 5 is a timing chart of signals related to detection of the abnormality in the clock signal. An uppermost part of FIG. 5 shows an example of the master clock signal MCK supplied to the digital control circuit 210. The example is an example in which the master clock signal MCK stops for some causes after a time point t1. That is, in this example, after the time point t1, the master clock signal MCK is fixed to a low level.

The digital control circuit 210 generates a rising edge and a falling edge of a pulse in the pulse density modulation according to a rising edge or a falling edge of the master clock signal MCK. Therefore, when the master clock signal MCK is fixed to the low level, the pulse of the control signal DHC cannot be changed. A fourth stage in FIG. 5 shows an example of the control signal DHC. As in the example shown in FIG. 5, at the time point t1, the pulse of the control signal DHC is at a high level. When the master clock signal MCK is fixed to the low level in this state, the control signal DHC does not change thereafter. Therefore, the control signal DHC is fixed to the high level. In this case, a state in which the voltage of the control voltage VHC output from the temperature control circuit 220 according to the control signal DHC is excessively high continues, and the temperature control element 4 excessively generates the heat.

Therefore, when the abnormality in the clock signal is detected, the oscillator 1 according to the embodiment has a function of stopping the output of the control voltage VHC to the temperature control element 4 by the temperature control circuit 220. Specifically, the clock signal abnormality detection circuit 300 controls presence or absence of the output of the control voltage VHC by the temperature control circuit 220. In the embodiment, the clock signal abnormality detection circuit 300 is an amplitude abnormality detection circuit that detects an abnormality in an amplitude of the clock signal.

Figure 6:
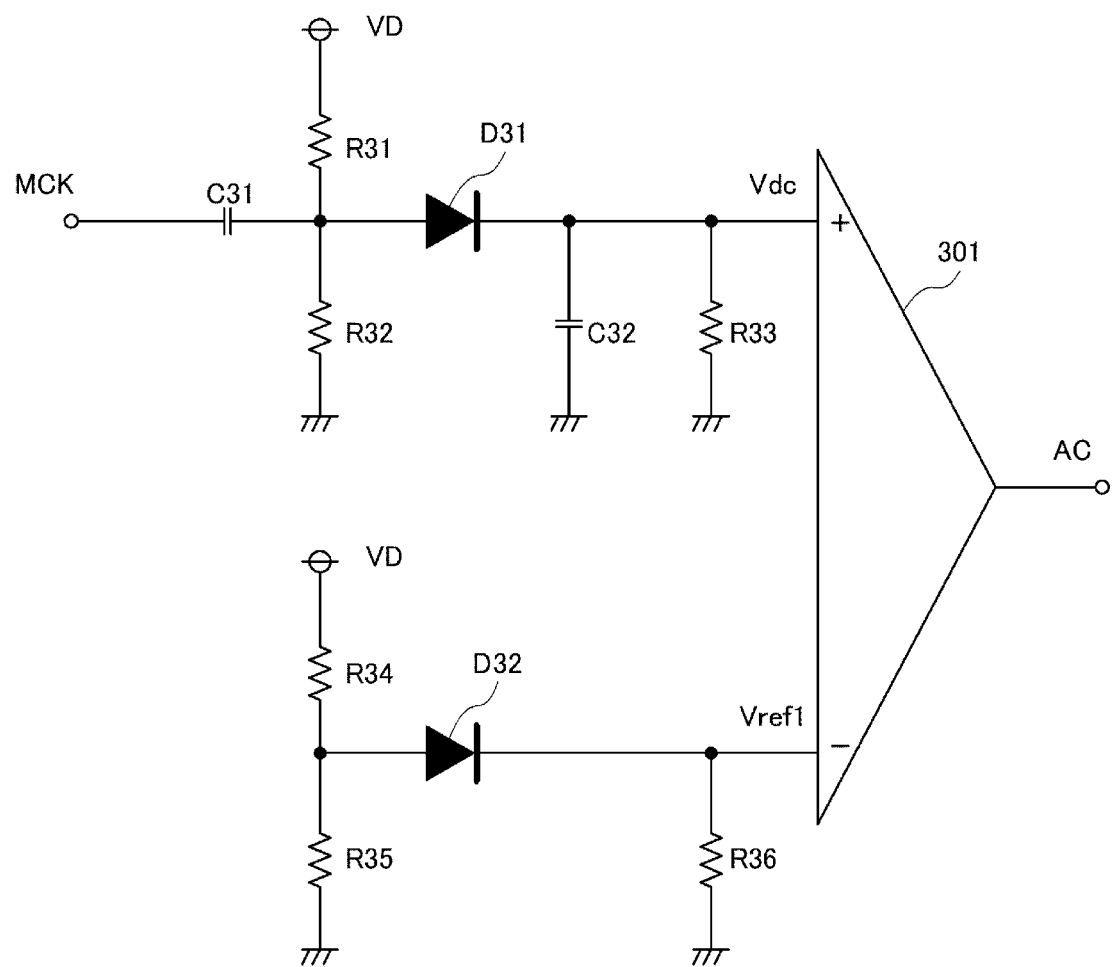
FIG. 6 is a diagram showing a clock signal abnormality detection circuit.

FIG. 6 is a diagram showing a configuration example of the clock signal abnormality detection circuit 300. The clock signal abnormality detection circuit 300 includes an input node to which the master clock signal MCK is input and an output node that outputs the output signal AC. The input node of the clock signal abnormality detection circuit 300 is a node to which the master clock signal MCK is supplied from the oscillation circuit 230. The output node of the clock signal abnormality detection circuit 300 is electrically coupled to an enable signal node of the temperature control circuit 220.

One node of a capacitor C31 is electrically coupled to the input node of the clock signal abnormality detection circuit 300. The other node of the capacitor C31 is electrically coupled to one node of resistance elements R31 and R32. The resistance elements R31 and R32 are elements coupled in series between a power supply node VD and a ground node, and set a potential of the node between the resistance elements R31 and R32 to a predetermined bias potential.

An anode of a diode D31 is electrically coupled to the node between the resistance elements R31 and R32. A cathode of the diode D31 is electrically coupled to an inverting input node (−) of a comparator 301. A capacitor C32 and a resistance element R33 are electrically coupled between a non-inverting input node (+) of the comparator

301 and the ground node. An output node of the comparator 301 is the output node of the clock signal abnormality detection circuit 300.

A circuit coupled to the non-inverting input node (+) is a circuit for identifying an amplitude level of the master clock signal MCK. Specifically, since the master clock signal MCK is input to the node between the resistance elements R31 and R32 via the capacitor C31, the master clock signal MCK is rectified by the diode D31. That is, when the master clock signal MCK input to the anode of the diode D31 is at a high level, a current flows from an anode side to a cathode side of the diode D31.

In this case, the non-inverting input node (+) of the comparator 301 has a potential equivalent to the high level of the master clock signal MCK. On the other hand, when the master clock signal MCK input to the anode of the diode D31 is at a low level, no current flows from the anode side to the cathode side of the diode D31. However, in this case, a current flows due to a charge accumulated in the capacitor C32, and the potential of the non-inverting input node (+) of the comparator 301 gradually decreases from the potential equivalent to the high level of the master clock signal MCK.

Therefore, the diode D31, the capacitor C32, and the resistance element R33 function as a peak detection circuit. Therefore, the potential of the non-inverting input node (+) of the comparator 301 is maintained at the potential equivalent to the high level of the master clock signal MCK when the master clock signal MCK is normal. On the other hand, when the master clock signal MCK stops and is fixed to the low level, the potential of the non-inverting input node (+) of the comparator 301 is at the low level. That is, a potential Vdc obtained by converting the master clock signal MCK into a DC potential is applied to the non-inverting input node (+) of the comparator 301.

On the other hand, a fixed reference potential Vref1 serving as a comparison reference is applied to the inverting input node (−) of the comparator 301. For this reason, in the embodiment, one node of a resistance element R34 is electrically coupled to the power supply node VD, and a resistance element R35 and an anode of the diode D32 are electrically coupled to the other node of the resistance element R34. The resistance element R35 is electrically coupled between the anode of the diode D32 and the ground node. A cathode of the diode D32 is electrically coupled to the inverting input node (−) of the comparator 301. A resistance element R36 is electrically coupled between the inverting input node (−) of the comparator 301 and the ground node. With the above configuration, the reference potential Vref1, which is a fixed potential divided from the power supply node VD, is applied to the inverting input node (−) of the comparator 301 according to a relationship between the resistance elements R34, R35, and R36 and the diode D32.

When the potential applied to the non-inverting input node (+) is larger than the potential applied to the inverting input node (−), the comparator 301 outputs a high-level signal to the output node. When the potential applied to the non-inverting input node (+) is lower than the potential applied to the inverting input node (−), the comparator 301 outputs a low-level signal to the output node.

The potential applied to the inverting input node (−) is the reference potential Vref1. The potential applied to the non-inverting input node (+) is the potential Vdc obtained by converting the master clock signal MCK into the DC potential. Therefore, the comparator 301 outputs the high-level signal when the potential Vdc is higher than the reference potential Vref1. The comparator 301 outputs the low-level signal when the potential Vdc is lower than the reference potential Vref1. Since the potential Vdc is a potential Vdc obtained by converting the master clock signal MCK into the DC potential, the potential Vdc is at the high level when the master clock signal MCK normally operates. For example, in the example shown in FIG. 5, before the time point t1, the master clock signal MCK normally operates. In this case, as shown in FIG. 5, the potential Vdc is at the high level. Therefore, when the master clock signal MCK normally operates, the output signal AC of the comparator 301 is at the high level. On the other hand, when the master clock signal MCK is stopped, the potential Vdc is at the low level. In the example shown in FIG. 5, the master clock signal MCK stops after the time point t1. In this case, as shown in FIG. 5, the potential Vdc gradually decreases and is eventually at the low level. As a result, at a time point t2, the potential Vdc is equal to or lower than the reference potential Vref1, and the output signal AC of the comparator 301 is at the low level.

The output node of the comparator 301 is the output node of the clock signal abnormality detection circuit 300, and is electrically coupled to the enable signal node of the temperature control circuit 220 (EN of the AND circuit 221 shown in FIG. 3). Therefore, when the master clock signal MCK normally operates as in the state before the time point t1 in the example shown in FIG. 5, the comparator 301 sets the enable signal node (EN) of the temperature control circuit 220 to the high level. That is, the operation of the temperature control circuit 220 is enabled. Therefore, in the temperature control circuit 220, the control signal DHC output from the digital control circuit 210 is output from the AND circuit 221. As a result, the control voltage VHC is output from the temperature control circuit 220, and the temperature of the temperature control element 4 is controlled.

On the other hand, when the master clock signal MCK is stopped as in the state after the time point t1 in the example shown in FIG. 5, the comparator 301 sets the enable signal node (EN) of the temperature control circuit 220 to the low level. That is, in the AND circuit 221 of the temperature control circuit 220, the enable signal node (EN) is fixed to the low level, and the output (ANDOUT shown in FIG. 5) of the AND circuit 221 is also fixed to the low level. As a result, the output of the analog buffer circuit 225 is fixed to the low level, and the control voltage VHC is not output from the temperature control circuit 220. Therefore, the operation of the temperature control circuit 220 is disabled, and the temperature control element 4 is prevented from excessively generating the heat.

Temperature Abnormality Monitoring by First Temperature Sensor

Next, the monitoring of the temperature abnormality by the first temperature sensor 5 will be described. A temperature detected by the first temperature sensor 5 is input to the digital control circuit 210 as the first temperature code DT1. When a temperature indicated by the first temperature code DT1 is equal to or lower than the first reference value, the digital control circuit 210 sets the output signal AT1 to the high level. When the temperature indicated by the first temperature code DT1 exceeds the first reference value, the digital control circuit 210 sets the output signal AT1 to the low level.

Figure 7:
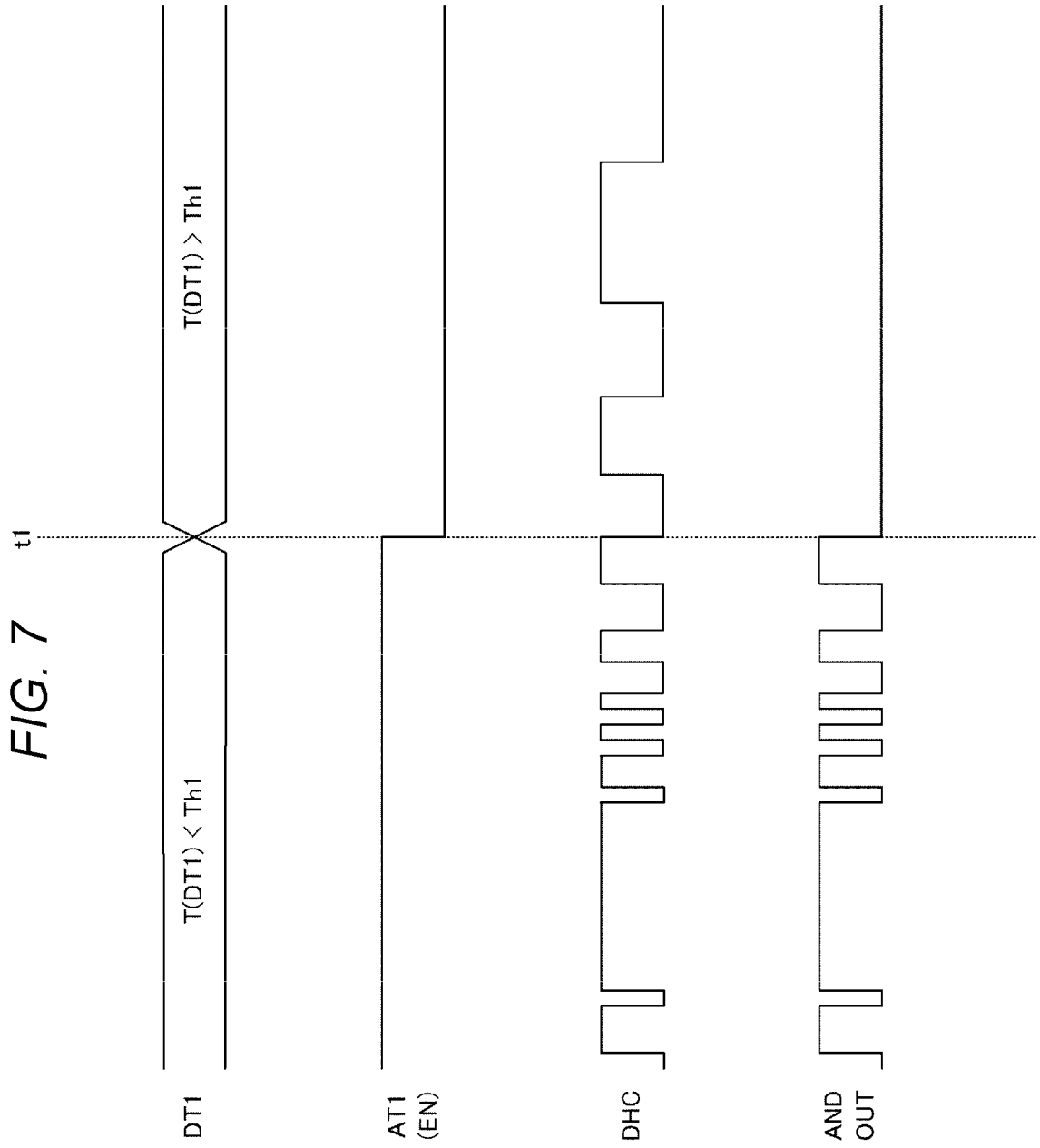
FIG. 7 is a timing chart of signals related to detection of an abnormality by a first temperature sensor.

FIG. 7 is a timing chart of signals related to detection of the abnormality due to the first temperature sensor. In FIG. 7, a temperature T(DT1) indicated by the first temperature code DT1 is shown in an uppermost part. The first reference value is Th1. In the example shown in FIG. 7, before the time point t1, it is assumed that the temperature T(DT1) indicated by the first temperature code DT1 is lower than the first reference value Th1. In this state, the digital control circuit 210 sets the output signal AT1 to the high level. The output signal AT1 is supplied to the enable signal node (EN) of the temperature control circuit 220. Therefore, in this case, in the temperature control circuit 220, the control signal DHC output from the digital control circuit 210 is output from the AND circuit 221. As a result, the control voltage VHC is output from the temperature control circuit 220, and the temperature of the temperature control element 4 is controlled.

On the other hand, after the time point t1, it is assumed that the temperature T(DT1) indicated by the first temperature code DT1 is higher than the first reference value Th1. In this state, the digital control circuit 210 sets the output signal AT1 to the low level. In this case, in the AND circuit 221 of the temperature control circuit 220, the enable signal node (EN) is fixed to the low level, and the output (AND-OUT shown in FIG. 7) of the AND circuit 221 is also fixed to the low level. As a result, the output of the analog buffer circuit 225 is fixed to the low level, and the control voltage VHC is not output from the temperature control circuit 220. Therefore, the operation of the temperature control circuit 220 is disabled, and the temperature control element 4 is prevented from excessively generating the heat.

Temperature Abnormality Monitoring by Second Temperature Sensor

Figure 8:
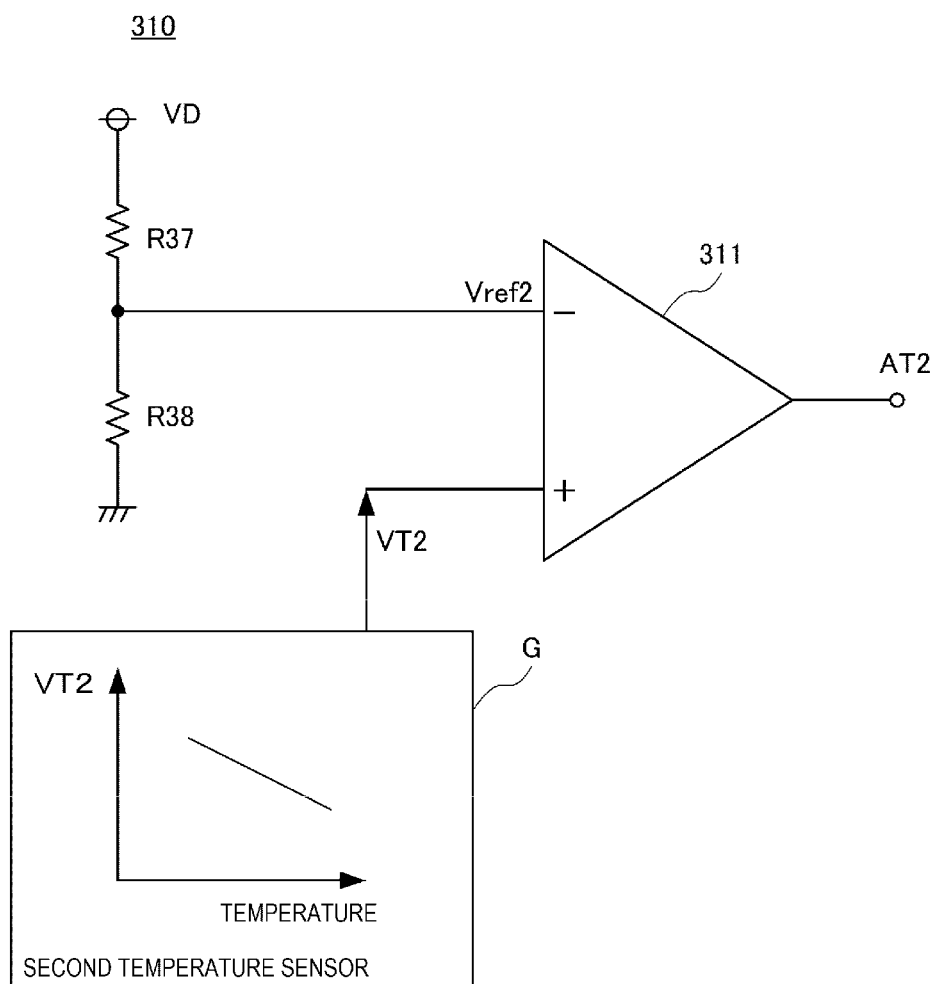
FIG. 8 is a diagram showing a second temperature sensor monitoring circuit.

Next, the second temperature sensor monitoring circuit 310 will be described in detail. FIG. 8 is a diagram showing an example of the second temperature sensor monitoring circuit 310. The second temperature sensor monitoring circuit 310 includes resistance elements R37 and R38 and a comparator 311. The resistance elements R37 and R38 are electrically coupled in series between the power supply node VD and the ground node. A node between the resistance elements R37 and R38 is electrically coupled to an inverting input node (−) of the comparator 311. A fixed potential obtained by dividing the potential of the power supply node VD by the resistance elements R37 and R38 is a reference potential Vref2 when the comparator 311 executes the comparison.

On the other hand, the second temperature detection signal VT2 output from the second temperature sensor 241 is input to the non-inverting input node (+) of the comparator 311. In FIG. 8, a graph G schematically shows a relationship between the temperature of the second temperature sensor 241 and the second temperature detection signal VT2. As shown in the graph G, the second temperature sensor 241 according to the embodiment has a characteristic that the higher the temperature, the smaller the second temperature detection signal VT2. Therefore, when the second temperature detection signal VT2 is lower than the reference potential, it can be determined that the temperature indicated by the second temperature detection signal VT2 exceeds a predetermined temperature.

When the potential applied to the non-inverting input node (+) is larger than the potential applied to the inverting input node (−), the comparator 311 outputs a high-level signal to the output node. When the potential applied to the non-inverting input node (+) is lower than the potential applied to the inverting input node (−), the comparator 311 outputs a low-level signal to the output node.

In the second temperature sensor monitoring circuit 310, the potential applied to the inverting input node (−) is the reference potential Vref2. The potential applied to the non-inverting input node (+) is the second temperature detection signal VT2.

Therefore, the comparator 311 outputs the high-level signal when the second temperature detection signal VT2 is higher than the reference potential Vref2. The comparator 311 outputs the low-level signal when the second temperature detection signal VT2 is lower than the reference potential Vref2.

As indicated by the graph G, the second temperature detection signal VT2 decreases as the temperature increases. Therefore, in the embodiment, the second reference value, which is an upper limit, is set for the temperature of the second temperature sensor 241. Further, a potential same as the second temperature detection signal VT2 output when the temperature of the second temperature sensor 241 is the second reference value is defined as the reference potential Vref2. That is, the resistance elements R37 and R38 are selected such that the reference potential Vref2 is applied to the inverting input node (−) of the comparator 301.

Figure 9:
FIG. 9 is a timing chart of signals related to detection of an abnormality by a second temperature sensor.

Therefore, when the temperature of the second temperature sensor 241 does not exceed the second reference value, the potential of the second temperature detection signal VT2 is higher than the reference potential Vref2, and the output signal AT2 of the comparator 311 is at the high level. On the other hand, when the temperature of the second temperature sensor 241 exceeds the second reference value, the potential of the second temperature detection signal VT2 is lower than the reference potential Vref2, and the output signal AT2 of the comparator 311 is at the low level. FIG. 9 is a timing chart of signals related to detection of the abnormality by the second temperature sensor. As shown in FIG. 9, when the second temperature detection signal VT2 is lower than the reference potential Vref2, the output signal AT2 of the comparator 311 is at the low level.

The output node of the comparator 311 is the output node of the second temperature sensor monitoring circuit 310, and is electrically coupled to the enable signal node (EN) of the temperature control circuit 220. Therefore, when the temperature of the second temperature sensor 241 is equal to or lower than the second reference value and the second temperature detection signal VT2 is higher than the reference potential Vref2, the comparator 311 sets the enable signal node (EN) of the temperature control circuit 220 to the high level. That is, the operation of the temperature control circuit 220 is enabled. Therefore, in the temperature control circuit 220, the control signal DHC output from the digital control circuit 210 is output from the AND circuit 221. As a result, the control voltage VHC is output from the temperature control circuit 220, and the temperature of the temperature control element 4 is controlled.

On the other hand, when the temperature of the second temperature sensor 241 exceeds the second reference value and the second temperature detection signal VT2 is lower than the reference potential Vref2, the comparator 311 sets the enable signal node (EN) of the temperature control circuit 220 to the low level. That is, in the AND circuit 221 of the temperature control circuit 220, the enable signal node (EN) is fixed to the low level, and the output (ANDOUT shown in FIG. 9) of the AND circuit 221 is also fixed to the low level. As a result, the output of the analog buffer circuit 225 is fixed to the low level, and the control voltage VHC is not output from the temperature control circuit 220. As a result, the operation of the temperature control circuit 220 is disabled, and the temperature control element 4 is prevented from excessively generating the heat.

As described above, in the embodiment, whether abnormal heat generation occurs in the temperature control element 4 is monitored based on a temperature detected by the first temperature sensor 5. Further, whether the abnormal heat generation occurs in the temperature control element 4 is monitored based on a temperature detected by the second temperature sensor 241. Therefore, the temperatures are monitored by two-system temperature sensors. According to the configuration, even when one of the temperature sensors fails, it is possible to identify the abnormal heat generation of the temperature control element 4 by the other temperature sensor, and it is possible to increase the chance that the abnormal heat generation can be prevented.

Further, in the embodiment, in addition to the two-system temperature sensors, whether the abnormality occurs in the clock signal is monitored. Therefore, the abnormal heat generation of the temperature control element 4 is prevented by a three-system method. Therefore, if any one system in the three-system method functions, even if a failure occurs in another system, the abnormal heat generation of the temperature control element 4 can be prevented. Therefore, it is possible to further increase the chance that the abnormal heat generation can be prevented.

Further, in the embodiment, the temperature control circuit 220, the second temperature sensor 241, and the second temperature sensor monitoring circuit 310 are formed in the integrated circuit 3, and are electrically coupled to one another by the wiring in the integrated circuit 3. On the other hand, the first temperature sensor 5 is present outside the integrated circuit 3, and is electrically coupled to the integrated circuit 3 via the wiring. That is, a pad provided in the first temperature sensor 5 and a wiring are coupled to each other, and the wiring and a pad provided in the integrated circuit 3 are coupled to each other. As described above, the first temperature sensor 5 and the second temperature sensor 241 have different elements for electrical coupling.

Therefore, both of the first temperature sensor 5 and the second temperature sensor 241 may fail due to different causes. For example, the coupling between the pad and the wiring may be cut due to vibration with respect to the oscillator 1 or contact of an object, and the wiring may be cut. On the other hand, even if such cutting occurs, the wiring in the integrated circuit 3 such as the second temperature sensor 241 is not cut in many cases. Therefore, as in the embodiment, when the abnormal heat generation of the temperature control element 4 is monitored by the two-system and three-system methods, there is a high chance that the abnormal heat generation of the temperature control element 4 can be prevented even if a failure occurs due to various causes.

Second Embodiment

Figure 10:
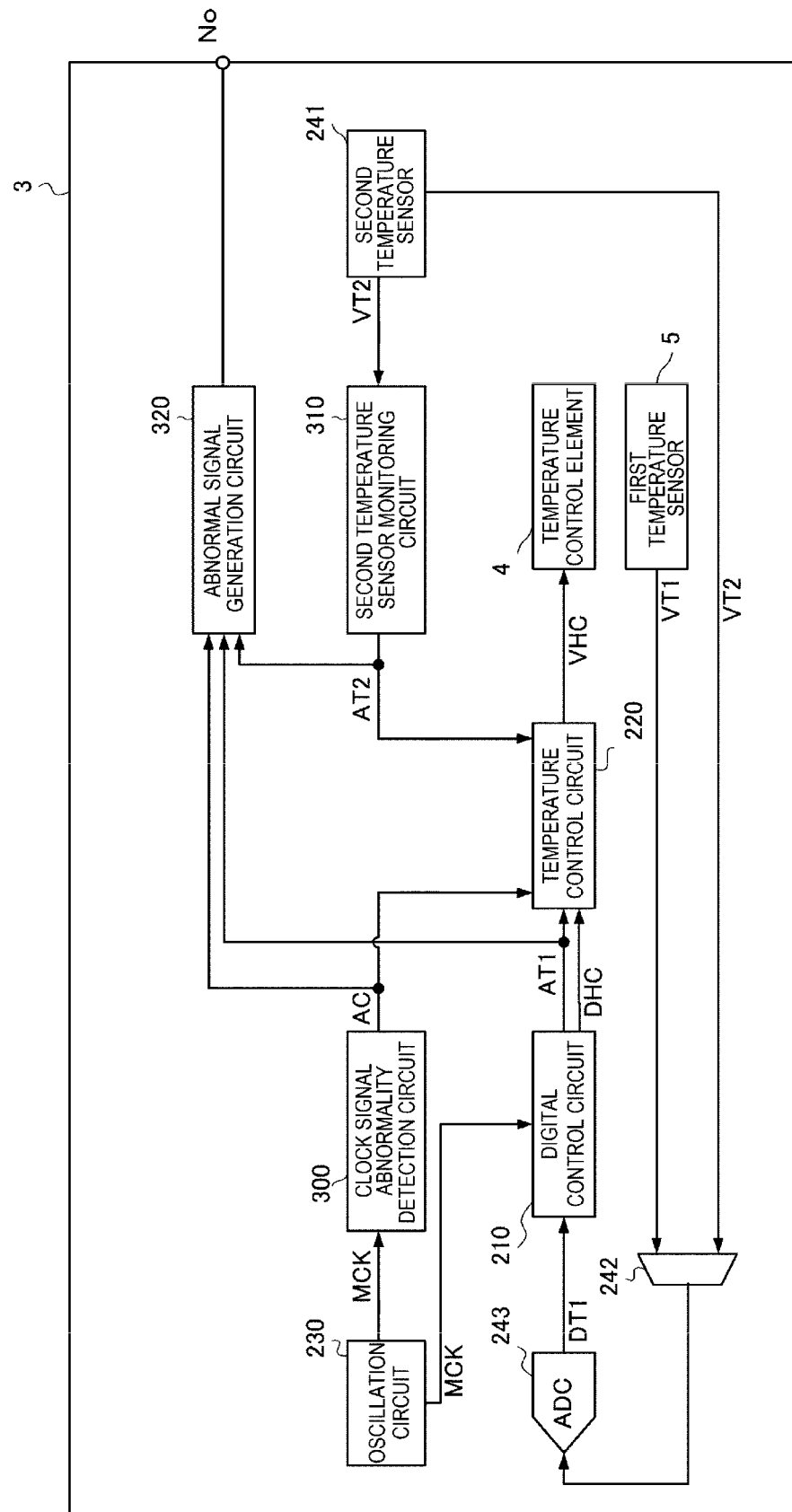
FIG. 10 is a functional block diagram showing a main part of an oscillator according to a second embodiment.

In the first embodiment, the temperature control element 4 is controlled so as not to abnormally generate heat. When an abnormality is detected, a signal indicating that the abnormality is detected may be output to the outside of the integrated circuit 3. FIG. 10 is a block diagram of the integrated circuit 3 having such a configuration. The configuration can be implemented by adding an abnormal signal generation circuit 320 and an external terminal No to the configuration shown in FIGS. 1 and 2.

The abnormality signal generation circuit 320 is a circuit that outputs an abnormality detection signal from the external terminal No to the outside when an abnormality is detected in the clock signal abnormality detection circuit 300. The abnormality signal generation circuit 320 is a circuit that outputs an abnormality detection signal to the outside from the external terminal No when an abnormality in a temperature of the first temperature sensor 5 is detected by the digital control circuit 210 and when an abnormality in a temperature of the second temperature sensor 241 is detected by the second temperature sensor monitoring circuit 310.

The abnormal signal generation circuit 320 may be implemented in various forms. For example, when an abnormality is detected in the clock signal abnormality detection circuit 300, an output signal AC from the clock signal abnormality detection circuit 300 changes from a high level to a low level. Therefore, when the abnormality signal generation circuit 320 is implemented by an inverter and a signal obtained by inverting a level of the output signal AC is output from the external terminal No, a high-level signal can be output from the external terminal No when the abnormality is detected in the clock signal abnormality detection circuit 300.

When the digital control circuit 210 detects an abnormality in the temperature of the first temperature sensor 5, an output signal AT1 from the digital control circuit 210 changes from a high level to a low level. Therefore, the abnormal signal generation circuit 320 may be implemented by an inverter, and a signal obtained by inverting a level of the output signal AT1 may be output from the external terminal No. According to the configuration, when the abnormality is detected in the digital control circuit 210, a high-level signal can be output from the external terminal No.

When the second temperature sensor monitoring circuit 310 detects an abnormality in the temperature of the second temperature sensor 241, an output signal AT2 from the second temperature sensor monitoring circuit 310 changes from a high level to a low level. Therefore, the abnormal signal generation circuit 320 may be implemented by an inverter, and a signal obtained by inverting a level of the output signal AT2 may be output from the external terminal No. According to the configuration, when the abnormality is detected in the second temperature sensor monitoring circuit 310, a high-level signal can be output from the external terminal No.

As a matter of course, the above configuration is an example. The abnormal signal generation circuit 320 may be a wiring that directly outputs the output signals AC, AT1, and AT2 from the external terminal No as long as an abnormality is not detected when the output signal from the external terminal No is at a high level and an abnormality is detected when the output signal from the external terminal No is at a low level. The abnormal signal generation circuit 320 may be implemented to output the output signals AC, AT1, and AT2 from the external terminal No via a buffer circuit. According to the above configuration, it is possible to identify whether the abnormality in the heat generation of the temperature control element 4 occurs based on the output signal from the external terminal No.

Third Embodiment

Figure 11:
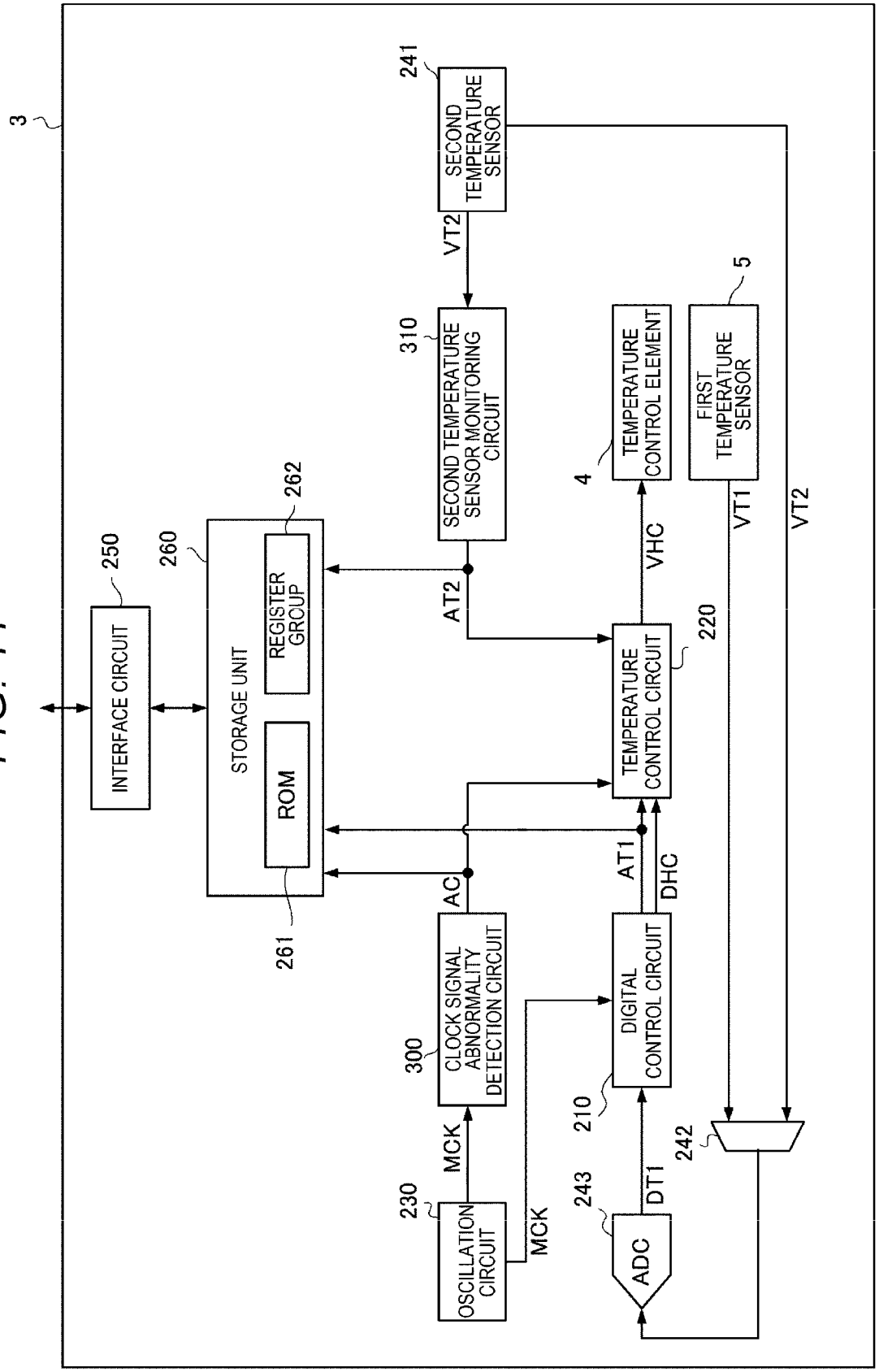
FIG. 11 is a functional block diagram showing a main part of an oscillator according to a third embodiment.

Further, when an abnormality is detected in the temperature control element 4, information indicating that the abnormality is detected may be held in the oscillator 1 and may be referred to by a user. FIG. 11 is a block diagram of the integrated circuit 3 having such a configuration. The configuration can be implemented by inputting an output signal AC of the clock signal abnormality detection circuit 300, an output signal AT1 of the digital control circuit 210, and an output signal AT2 of the second temperature sensor monitoring circuit 310 to the storage unit 260 in the same configuration as in FIG. 1.

FIG. 11 shows the same circuits as in FIG. 2, the interface circuit 250, and the storage unit 260 that are extracted from such a configuration. In the circuits shown in FIG. 11, when an abnormality is detected in the clock signal abnormality detection circuit 300, the storage unit 260 stores information indicating the abnormality in the clock signal in the storage unit 260. That is, when an abnormality in a master clock signal MCK is detected by the clock signal abnormality detection circuit 300 and an output signal AC changes from a high level to a low level, a signal indicating that the abnormality in the clock signal occurs is transferred to the register group 262. As a result, flag indicating that the abnormality occurs in the clock signal is held in a specific register included in the register group 262. The user can read a value of the flag held in the specific register via an external device coupled to the interface circuit 250. Further, when the value of the flag held in the specific register indicates the abnormality in the clock signal, the user can recognize that an abnormality such as a stop of the master clock signal MCK occurs.

When the digital control circuit 210 detects an abnormality in the temperature of the first temperature sensor 5, the storage unit 260 stores information indicating the abnormality in the temperature of the first temperature sensor 5 in the storage unit 260. That is, when the temperature of the first temperature sensor 5 indicated by the first temperature code DT1 exceeds the first reference value, the digital control circuit 210 changes the output signal AT1 from a high level to a low level. When the output signal AT1 changes from the high level to the low level, a signal indicating that the temperature control element 4 excessively generates the heat is transferred to the register group 262. As a result, flag indicating that the temperature control element 4 excessively generates the heat is held in a specific register included in the register group 262. The user can read a value of the flag held in the specific register via an external device coupled to the interface circuit 250. Further, when the value of the flag held in the specific register indicates that the temperature control element 4 excessively generates the heat, the user can recognize that the excessive heat generation of the temperature control element 4 is detected based on the first temperature sensor 5.

Further, when the digital control circuit 210 detects an abnormality in the temperature of the second temperature sensor 241, the storage unit 260 stores information indicating the abnormality in the temperature of the second temperature sensor 241 in the storage unit 260. That is, when the temperature of the second temperature sensor 241 indicated by the second temperature detection signal VT2 exceeds the second reference value, the second temperature sensor monitoring circuit 310 changes the output signal AT2 from a high level to a low level. When the output signal AT2 changes from the high level to the low level, a signal indicating that the temperature control element 4 excessively generates the heat is transferred to the register group 262. As a result, flag indicating that the temperature control element 4 excessively generates the heat is held in a specific register included in the register group 262. The user can read a value of the flag held in the specific register via an external device coupled to the interface circuit 250. Further, when the value of the flag held in the specific register indicates that the temperature control element 4 excessively generates the heat, the user can recognize that the excessive heat generation of the temperature control element 4 is detected based on the second temperature sensor 241.

Each of the embodiments described above is an example of carrying out the disclosure. Therefore, the configuration of each unit can be replaced with any configuration having the same function. For example, the configurations of the temperature control circuit 220, the clock signal abnormality detection circuit 300, and the second temperature sensor monitoring circuit 310 are merely examples, and other elements such as a capacitor, a resistance element, and a diode may be added. Three types of external terminals may be provided as the external terminal No according to the cause of the abnormality. Any other constituents may be added to the embodiments described above. Further, each of the embodiments described above may be combined as appropriate.

What is claimed is:

1. An oscillator comprising:
   a resonator element;
   an oscillation circuit configured to oscillate the resonator element to generate a clock signal;
   a first temperature sensor;
   a digital control circuit configured to operate based on the clock signal and output a control signal based on a temperature detected by the first temperature sensor;
   a temperature control circuit configured to output a control voltage based on the control signal;
   a temperature control element configured to control a temperature of the resonator element based on the control voltage;
   a second temperature sensor; and
   a second temperature sensor monitoring circuit including an analog circuit and configured to monitor a temperature detected by the second temperature sensor, wherein
   the digital control circuit monitors the temperature detected by the first temperature sensor and stops a supply of the control voltage to the temperature control element performed by the temperature control circuit when an abnormality in the temperature is detected, and
   the second temperature sensor monitoring circuit stops the supply of the control voltage to the temperature control element performed by the temperature control circuit when an abnormality in the temperature of the second temperature sensor is detected.

2. The oscillator according to claim 1, wherein
   the temperature control circuit, the second temperature sensor, and the second temperature sensor monitoring circuit are formed in an integrated circuit, and
   the first temperature sensor is present outside the integrated circuit.

3. The oscillator according to claim 1, further comprising:
   a clock signal abnormality detection circuit configured to detect an abnormality in the clock signal, wherein
   the clock signal abnormality detection circuit stops an output of the control voltage to the temperature control element performed by the temperature control circuit when the abnormality in the clock signal is detected.

4. The oscillator according to claim 3, wherein
   the clock signal abnormality detection circuit is an amplitude abnormality detection circuit configured to detect an abnormality in an amplitude of the clock signal.

5. The oscillator according to claim 1, further comprising:
   an external terminal configured to output an abnormality detection signal to the outside in at least one of a case in which the abnormality in the temperature of the first temperature sensor is detected in the digital control circuit and a case in which the abnormality in the temperature of the second temperature sensor is detected in the second temperature sensor monitoring circuit.

6. The oscillator according to claim 1, further comprising:
a storage unit, wherein
in at least one of a case in which the abnormality in the temperature of the first temperature sensor is detected in the digital control circuit and a case in which the abnormality in the temperature of the second temperature sensor is detected in the second temperature sensor monitoring circuit, information indicating the abnormality in the temperature is stored in the storage unit.

* * * * *